United States Patent [19]
Isaak

[11] Patent Number: 5,832,599
[45] Date of Patent: Nov. 10, 1998

[54] METHOD OF INTERFACING DETECTOR ARRAY LAYERS

[75] Inventor: Harlan R. Isaak, Costa Mesa, Calif.

[73] Assignee: Northrop Grumman Corporation, Los Angeles, Calif.

[21] Appl. No.: 824,741

[22] Filed: Mar. 26, 1997

Related U.S. Application Data

[62] Division of Ser. No. 404,530, Mar. 15, 1995, Pat. No. 5,661,267.

[51] Int. Cl.⁶ .............................. H05K 3/34; H05K 3/02; H05K 3/42
[52] U.S. Cl. ............................... 29/840; 29/831; 29/852; 29/DIG. 22; 228/180.22; 427/97
[58] Field of Search ........................... 29/831, 840, 852, 29/DIG. 22; 228/180.22; 75/688; 361/760; 427/97

[56] References Cited

U.S. PATENT DOCUMENTS

| | | | |
|---|---|---|---|
| 4,794,092 | 12/1988 | Solomon | 437/51 |
| 4,907,128 | 3/1990 | Solomon et al | 361/412 |
| 4,988,641 | 1/1991 | Solomon | 437/83 |
| 4,992,908 | 2/1991 | Solomon | 361/400 |
| 5,067,233 | 11/1991 | Solomon | 29/852 |
| 5,075,201 | 12/1991 | Koh | 430/321 |
| 5,128,749 | 7/1992 | Hornback et al. | 357/80 |
| 5,129,142 | 7/1992 | Bindra et al. | 29/852 |
| 5,135,556 | 8/1992 | Hornback et al. | 65/43 |
| 5,138,164 | 8/1992 | Koh | 250/339 |
| 5,149,671 | 9/1992 | Koh et al. | 437/183 |
| 5,208,478 | 5/1993 | Solomon | 257/443 |
| 5,209,798 | 5/1993 | Solomon et al. | 156/153 |
| 5,245,751 | 9/1993 | Locke et al. | 29/852 |
| 5,290,423 | 3/1994 | Helber, Jr. et al. | 29/340 X |
| 5,509,203 | 4/1996 | Yamashita | 439/91 X |
| 5,621,193 | 4/1997 | Isaak et al. | 174/262 |
| 5,758,413 | 6/1998 | Chong et al. | 29/852 |

FOREIGN PATENT DOCUMENTS

| | | | |
|---|---|---|---|
| 1057792 | 3/1989 | Japan | 29/852 |
| 4342192 | 11/1992 | Japan | 29/852 |
| 5110254 | 4/1993 | Japan | 29/852 |

*Primary Examiner*—Peter Vo
*Attorney, Agent, or Firm*—Stetina Brunda Garred & Brucker

[57] ABSTRACT

An alignment board for interfacing arrays of infrared detectors to a multi-layer module concerns an insulating board having a multiplicity of conductive vias with insulating sealing plugs and enlarged metallic pads that are attached to the ends of the vias. Preferably, an insulating layer is formed on opposing sides of the board. Openings are delineated in the layer coinciding with the metallic pads, and preferably solder contacts are deposited in the openings. A multi-layer module may be attached to one side of the alignment board using reflow solder processes. Then, arrays of infrared detectors may be attached to the opposing side of the alignment board using a lower-temperature reflow soldering process. The alignment board facilitates the interfacing and assembly of the focal plane of infrared detection systems.

6 Claims, 3 Drawing Sheets

METHOD OF INTERFACING DETECTOR ARRAY LAYERS

This application is a divisional of Ser. No. 08/404,530, filed Mar. 15, 1995, now U.S. Pat. No. 5,661,267.

FIELD OF THE INVENTION

The present invention relates generally to interfacing arrays of infrared detectors to integrated circuit modules, and more particularly to an alignment board for interfacing detectors to a multi-layer module having layers disposed transverse to the plane of the detectors.

BACKGROUND OF THE INVENTION

Space-based surveillance systems use infrared detectors coupled to computerized data processors for monitoring heated objects and their movements in the atmosphere below and on the ground. The function of infrared detectors is to respond to energy of a wave length within some particular portion of the infrared region. Heated objects dissipate thermal energy having characteristic wave lengths within the infrared spectrum. The infrared spectrum covers a wide range of wave lengths, from about 0.75 micrometers to 1 millimeter. Different levels of thermal energy, corresponding to different sources of heat, are characterized by the emission of signals within different portions of the infrared frequency spectrum. Detectors are selected in accordance with their sensitivity in the range of interests to the designer. Similarly, electronic circuitry that receives and processes the signals from the infrared detectors is also selected in view of the intended detection functions.

Current infrared detection systems incorporate arrays of large numbers of discrete, highly sensitive detector elements the outputs of which are connected through sophisticated processing circuitry. It is difficult, however, to actually construct structures that make a million or more detector elements and associated circuitry in a reliable and practical manner. Practical applications for contemporary infrared detection systems necessitate that further advances be made in the reliability and economical production of assemblies of detector arrays and accompanying circuitry.

Because the array material is very thin, less than 0.005 inches, difficulties arise in attaching the array material to the base of the module. One such difficulty is the inability of the detector material to absorb forces generated by the mismatched coefficient of expansion between the module and the array material. An additional difficulty encountered is providing a means for testing the reliability of the individual detector elements. Where the detector material is applied directly to the module body it is difficult to isolate a fault that may be attributable to either the detector elements, module wiring or processing elements. Schmitz, U.S. Pat. No. 4,792,672, also assigned to Grumman Aerospace Corporation, addressed those issues with a buffer board disposed intermediate the detector array segment and the multi-layer module. The buffer board facilitates assembly of the detectors to the multi-layer module, and also enhances the structural characteristics and separate testability of the system components.

Considerable difficulties are also presented in aligning the detector elements with conductors on the connecting module and in isolating adjacent conductors in such a dense environment. Indium bumps and flip-chip bump bonding techniques are commonly used for high-density interconnection in integrated circuitry, such as here between infrared detector rays and signal processing modules. Indium bumps 30 to 40 microns in diameter and spaced approximately 100 microns apart (center to center) are typically formed in arrays upon two substrate surfaces to be electrically connected, such that the indium bumps will fuse when brought into contact and forced together. Each indium bump may be connected to a conductive conduit which provides electrical communication to integrated circuitry formed upon the substrate. In the present application the opposing substrate supports an infrared detector array containing 1000 or more detector pixels are formed upon a semiconductor substrate, and must be electrically connected to signal conditioning electronics formed upon the other semiconductor substrate.

The conventional positioning of detector arrays relative to multi-layer modules for attachment and electrical connection is a difficult process. Careful positioning and a means to maintain the position under various temperature conditions is required. Small sections of detectors are positioned and held by precision tooling, until a bonding media such as epoxy can cure to form a permanent structure. Epoxy materials may shrink, or absorb moisture and expand, changing the position of the detectors.

Although prior art practices of forming indium contact bumps and bonding arrays of infrared detectors to signal processing modules have proven generally suitable for their intended purposes, they possess inherent deficiencies which detract from their overall effectiveness in the marketplace. In view of the shortcomings of the prior art, it is desirable to provide a method for bonding integrated circuit modules together with bump contacts which is simpler to practice and which has a higher yield than contemporary processes. It is also desirable to circumvent the use of adhesives during the positioning of the detector arrays, and instead rely on another method of manufacture.

SUMMARY OF THE INVENTION

The present invention specifically addresses and alleviates the above-mentioned deficiencies associated with the prior art. Generally, the present invention comprises an alignment board for positioning arrays of infrared detectors relative to multi-layer integrated circuit modules for structural attachment and electrical connection. The structural and electrical connections are preferably made using reflow soldering processes, and the alignment board becomes part of the final assembly of the infrared detection system. The design of the alignment board includes metallized via interconnects with insulating material sealing plugs contained therein. Metallic pads are added on preferably both ends of the vias to enlarge the area for bump bonding, making the alignment easier.

More particularly, the preferred embodiment of the alignment board of the present invention is comprised of a thin yet stiff insulating material, through which a multiplicity of through-holes are located. Conductive vias are formed in the through-holes, having a preferably gold coating attached to the inside wall of the through-holes. The alignment board further includes preferably a glass material within the conductive vias, to form sealing plugs. The sealing plugs help protect the vias from damage during subsequent manufacturing operations. It is also desirable not to leave voids in the alignment board, which could lead to a collecting area for contaminants, or an outgassing problem when the alignment board is used for space-based applications.

The alignment board further includes a multiplicity of thin metallic pads that are structurally formed on and electrically connected to preferably both of the opposing ends of the vias. The diameter of the metallic pads is preferably substantially larger than the diameter of the opposing ends of the via, such that the metallic pads completely cover the opposing ends of the vias. The preferred embodiment of the alignment board further comprises a thin insulating layer attached to the opposing sides over the board and over the metallic pads, with holes in the insulating layer that coincide with the metallic pads. The holes in the insulating layer are preferably of a small enough diameter not to cover the outside edges of the metallic pads, yet of a diameter greater than the ends of the vias. Preferably indium contacts are attached to the metallic pads inside the openings in the insulating layer. The diameter of the indium contacts is larger than the diameter of the opposing ends of the vias.

The preferred method of building up the assembly using the alignment board is to attach the multi-layer module to the alignment board, and then attach the infrared detector arrays to the alignment board. Reflow soldering is preferably used to make the connections, with solder surface tension preferably playing a part in determining the position of the lightweight detector arrays relative to the alignment board.

These as well as other advantages of the present invention will become more apparent from the following description and drawings. It is well understood that changes in the specific structure shown and described may be made within the scope of the claims without departing from the spirit of the invention.

DETAILED DESCRIPTION OF THE PREFERRED EMBODIMENT

The detailed discussion set forth below in connection with the appended drawings is intended as description of the presently preferred embodiment of the invention, and not intended the only form in which the present invention may be constructed or utilized. The description sets forth the functions and sequence of steps for constructing and operating the invention in connection with the illustrated embodiment. It is to be understood, however, that the same or equivalent functions and sequences may be accomplished by different embodiments that are also intended to be encompassed within the spirit and scope of the invention.

Figure 1A:
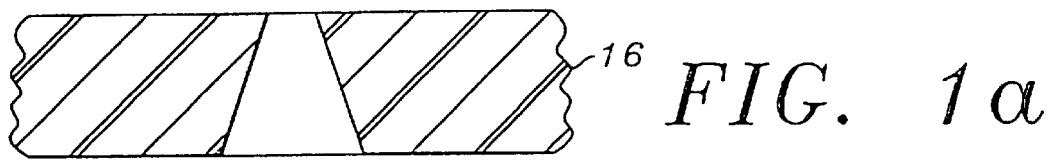
FIG. 1a to 1j are a series of side views illustrating the step by step process in manufacturing the alignment board of the present invention.
Figure 1B:
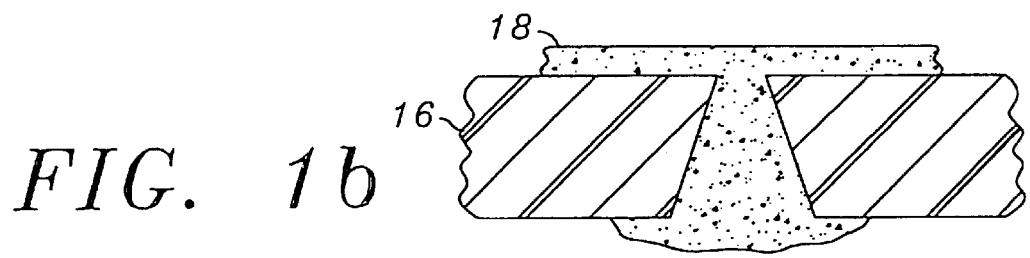
Figure 1C:
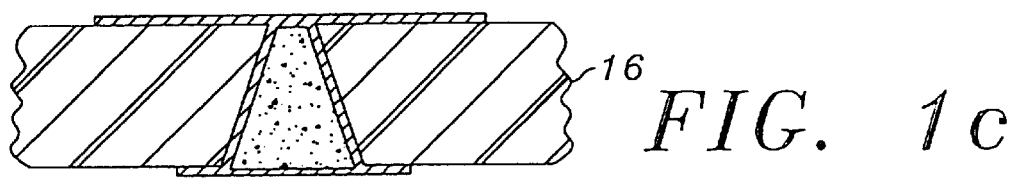
Figure 1D:
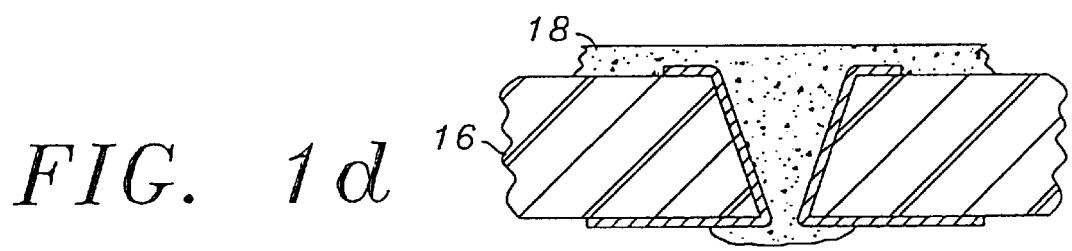
Figure 1E:
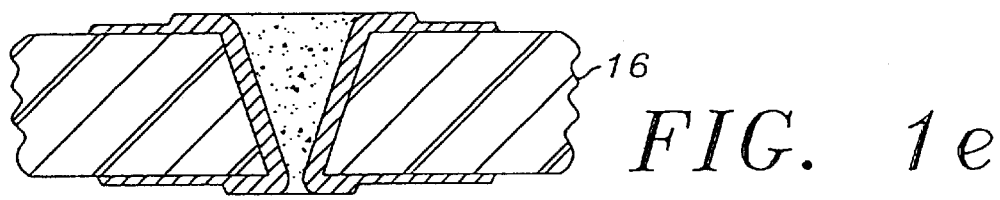
Figure 1F:
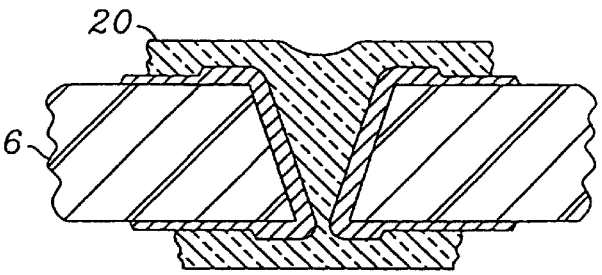
Figure 1G:
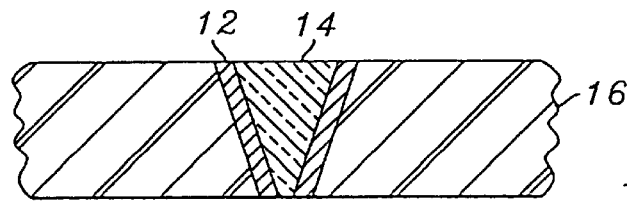

The manufacturing sequence to build up the alignment board 10 of the present invention is illustrated in FIGS. 1a–j, which depict the presently preferred embodiment of the invention. FIGS. 1a–g show the installation of a conductive via 12 with an insulating material sealing plug 14 installed therein. FIG. 1a shows a through-hole preferably laser drilled in the substrate 16, having a larger diameter on one end than the other, typical of holes formed by laser drilling. Other shapes, sizes and configurations of through-holes may be fabricated. FIG. 1b shows application, preferably by screen printing, of a metallo-organic material 18, preferably gold, over the through-hole, while preferably utilizing vacuum assist to pull the material through the through-hole. FIG. 1c shows that after firing preferably at approximately 850° C., a metallic coating is formed upon the walls of the through-hole. FIG. 1d shows that optionally, after inverting the substrate 16, a second application of metallo-organic material 18 is made in the through-hole. FIG. 1e shows that after a second firing, a second metallic coating is formed on the inside walls of the through-hole. FIG. 1f shows filling the via 12 with an insulating material 20, preferably high-temperature glass. The recommended material is ESL 4905 Special Fine Particle Glass available from Electro Science Labs located in King of Prussia, Pa. FIG. 1g shows that after firing at approximately 850° C. a sealing plug 14 is formed within the via 12. Refiring the temperature resistant via 12 at up to 550° C. during any subsequent processing has no effect on the via 12. Then, excess metallic 18 and insulating 20 material is removed from both sides of the substrate 16, preferably by lapping away the excess to form a substantially flush surface on both sides of the substrate 16. The final plugged and lapped surface may be cleaned using an ultrasonic cleaning process.

Figure 1H:
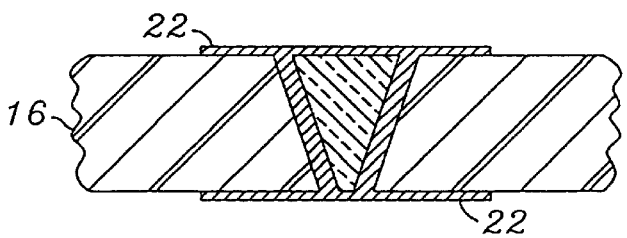
Figure 1I:
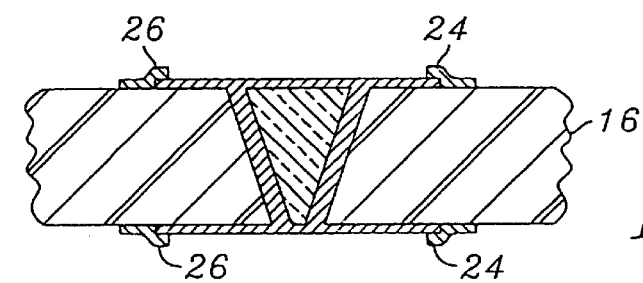
Figure 1J:
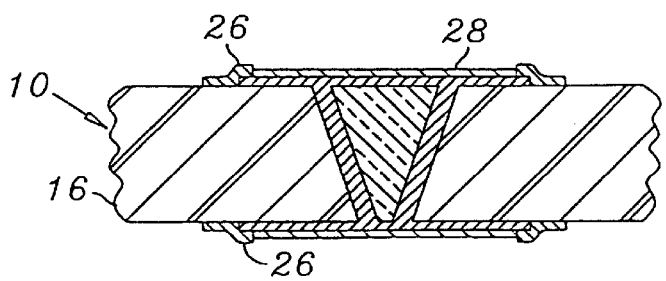

Next, the remaining operations to make up the alignment board 10 of the present invention are performed. FIG. 1h shows both sides of the substrate 16 at the vias 12 metallized with metallo-organic material 18, preferably gold. The area of the metallic pad 22 is delineated such that it is substantially larger than the area of the larger end of the via 12. FIG. 1i shows that a thin insulating layer 24, preferably polyamide is added over both sides of the substrate 16. Openings in the insulating layer 24 are delineated to form sockets 26 above the metallic pads 22. FIG. 1j shows that a solder pad 28, an alloy of indium with the appropriate melting point, is deposited into each socket 26 on both sides of the substrate 16. The socket 26 in the insulating layer 24 must be shallow enough to allow the bump contacts 30 of the mating parts, multi-layer modules 40 and infrared detector arrays 50 (see FIGS. 2 and 3), to contact the indium pads 28. But each socket 26 must be deep enough to contain the indium pad 28 upon reflow, to prevent shorting between the indium pads 28. The alignment board 10 is now ready for assembly.

Figure 2:
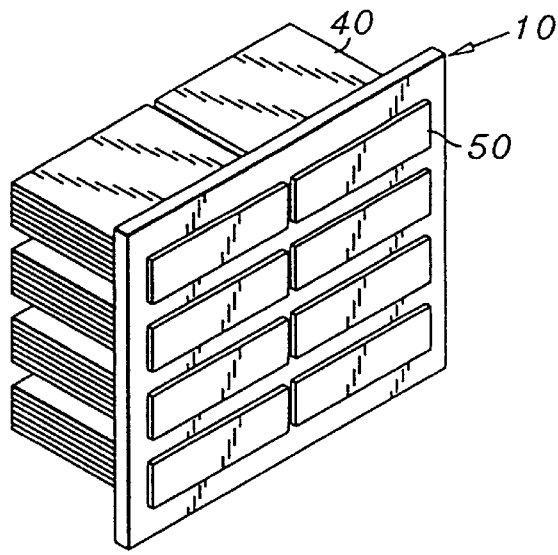
FIG. 2 is a perspective view showing the assembly of multi-layer modules and arrays of infrared detectors to the alignment board.

The method of using the alignment board 10 of the present invention will be described, to facilitate positioning and attachment of the multi-layer modules 40 to the arrays of infrared detectors 50 as shown in FIG. 2. Preferably, the modules 40 and the detector arrays 50 are attached by conventional reflow solder methods. Reflow soldering is a process employed extensively in high-density electronics manufacturing. Solder paste containing a powdered metal alloy dispersed in a liquid medium, containing an organic solvent flux and a thickening agent, is applied between miniature electronics components. Then, the soldered joint is subjected to a sufficiently high-temperature, generally 30°–50° C. greater than the melting point of the alloy in the solder. The elevated temperature causes the flux and the alloy to liquify and contact the components, so that upon subsequent cooling the components are soldered together.

The multi-layer modules 40 are preferably attached to the alignment board 10 first, before the detector arrays 50, by the reflow solder methods. Then, the detector arrays 50 are attached to the opposite side of the alignment board 10, also by reflow solder. A lower temperature solder 28 is preferably used on the detector side of the alignment board 10, so that the multi-layer modules 40 do not become unsoldered during the detector array 50 solder operation. The position of the detector arrays 50 is determined by the locational accuracy of the indium solder 28 on the alignment board 10, and also in part by solder surface tension from the soldering operation.

Figure 3A:
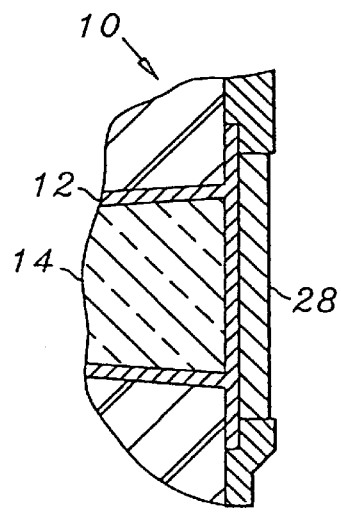
FIG. 3a is an enlarged view of a portion of FIG. 3.
Figure 3:
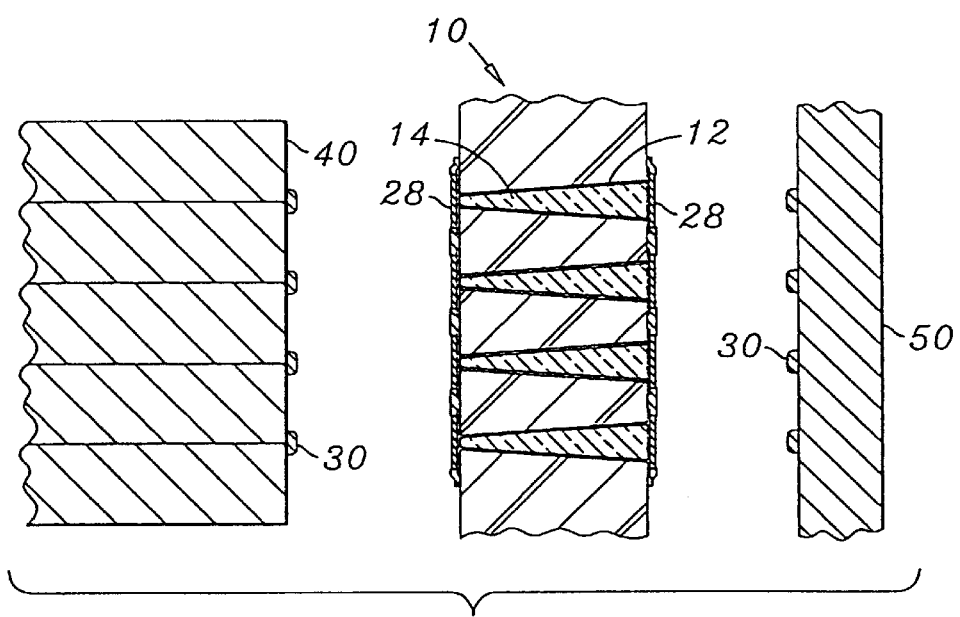
FIG. 3 is an exploded side view showing assembly of a single multi-layer module and infrared detector array to the alignment board.

FIG. 3 shows the indium pad 28/bump contact 30 interconnect of the alignment board 10 to the multi-layer modules 40 and the detector arrays 50. FIG. 3a shows the structural detail of the alignment board 10 as configured at one location to attach to the detector array 50. The indium pad 28, within the opening in the insulating layer 26, is attached to the metallic pad 22 which in turn is attached to the conductive via 12. An enlarged surface area the size of the indium pad 28 is provided to connect to the bump contact 30 of the detector array 50. A similar enlarged indium pad 28 is provided on the opposing side of the alignment board 10 to connect to the bump contact 30 of the multi-layer module 40. The detector arrays 50 and the alignment board 10 are, in part, self-aligned, because of the balancing of the surface tension between each respective well defined solder pool of the bump contact 30 and the indium pad 28 and the underlying surfaces of the detector arrays 50 and the alignment board 10.

The alignment board 10 of the present invention may be utilized to position and attach the multi-layered module 40 to the detector arrays 50, without the complicated tooling and glue which was conventionally used to make the assembly. It is understood that the exemplary alignment board 10 shown in the drawing represents only a presently preferred embodiment of the invention. Indeed, various modifications and additions may be made to the preferred embodiment without departing from the spirit and scope of the invention. Thus, modifications and additions may be obvious to those skilled in the art and may be implemented to adapt the present invention for use in a variety of applications.

What is claimed is:

1. A method for interfacing arrays of infrared detectors to multi-layer integrated circuit modules, each layer having a plurality of conductive conduits formed thereon, the method comprising the steps of:

a) forming an alignment board from an insulating material, the board having first and second opposing sides;

b) forming a multiplicity of through-holes in the board extending between the first and second opposing sides;

c) forming conductive vias in the through-holes, the vias having first ends at the first side of the board, and the vias having second ends at the second side of the board;

d) forming sealing plugs of an insulating material in the conductive vias, the sealing plugs completely filling the vias;

e) attaching first metallic pads to the first ends of the vias, the first metallic pads being sized larger than the first ends of the vias attached thereto;

f) abutting a multi-layer intergrated circuit module to the first side of the alignment board, such that the conductive conduits on the layers of the modules are in electrical communication with the first ends of the conductive vias of the alignment board; and g) connecting a plurality of infrared detector arrays to the second side of the alignment board, such that the detectors are in electrical communication with the second ends of the conductive vias of the alignment board.

2. The method of claim 1, further comprising the step of attaching second metallic pads to the second ends of the vias, the second metallic pads sized larger than the second ends of the vias attached thereto.

3. The method of claim 1, wherein the step of connecting the detectors to the alignment board is by reflow solder.

4. The method of claim 1, wherein the step of connecting the conductive conduits to the alignment board is by reflow solder.

5. The method of claim 4, wherein the step of connecting the detector arrays to the alignment board is affected by the solder surface tension.

6. The method of claim 5, wherein the step of abutting the multi-layer module uses a higher melting temperature solder than that used in the step of connecting the infrared detector arrays, such that solder will not reflow during connection of the infrared detector arrays.

* * * * *